United States Patent [19]
Brown

[11] 3,755,807
[45] Aug. 28, 1973

[54] RESISTOR-LADDER CIRCUIT

[75] Inventor: James L. Brown, Marion, Iowa
[73] Assignee: Collins Radio Company, Dallas, Tex.

[22] Filed: Feb. 15, 1972
[21] Appl. No.: 226,475

[52] U.S. Cl. .......... 340/347 DA, 307/304
[51] Int. Cl. .......... H03k 13/04
[58] Field of Search .......... 340/347 DA; 307/251, 307/304

[56] References Cited

UNITED STATES PATENTS

| | | | |
|---|---|---|---|
| 3,541,354 | 11/1970 | Basham | 340/347 DA |
| 3,646,587 | 2/1972 | Shaffstall et al. | 340/347 DA |
| 3,651,517 | 3/1972 | Kurek et al. | 340/347 DA |
| 3,626,407 | 12/1971 | Drangeid et al. | 340/347 DA |
| 2,954,551 | 9/1960 | Doucette et al. | 340/347 DA |

OTHER PUBLICATIONS

Schmid "Electronic Analog/Digital Conversions" 1970, pg. 182–186.

*Primary Examiner*—Charles D. Miller
*Attorney*—Henry K. Woodward

[57] ABSTRACT

An accurate resistor-ladder circuit using field-effect transistor switches. The field-effect transistors have on-resistances related to each other by a power of two whereby the cumulative resistances of said ladder produce accurate digital-to-analog conversion. Advantageously, the related resistance values of the FET's are such as to lend themselves to integrated circuit implementation. Through use of "mirror" switch networks, deleterious effects of integrated circuit leakage currents are minimized.

7 Claims, 6 Drawing Figures

RESISTOR-LADDER CIRCUIT

This invention relates generally to resistor-ladder circuits, and more particularly to resistor-ladder circuits with switching means employing semiconductor integrated circuit techniques.

The use of resistor-ladder networks for digital-to-analog electrical-signal conversion is well known in the art, as evidenced by texts on the subject such as Schmid, *Electronic Analog/Digital Conversions*, Van Nostrand Reinhold Company, 1970, pages 165–229. As discussed by Schmid, by selectively switching a resistor network in accordance with a digital code, an analog signal corresponding to the digital code may be generated.

Conversion accuracy of such converters is limited by the accuracy of the resistance values in the ladder network. Heretofore, the effect of switch resistance on accuracy has been minimized by providing negligibly small switch-on resistance. Thus, mechanical relay switches or bipolar semiconductor switches have been required for highly accurate resistor-ladder converters. As recognized by Schmid, supra, pages 177–178, the use of field-effect transistors (FET) or metal-oxide semiconductor field-effect transistors (MOSFET) switches in such networks has not been feasible because of the large geometry switching transistors required to achieve negligibly small on-resistances of the analog switches. Thus, use of the increasingly popular MOS integration techniques has heretofore found little or no applicability in resistor-ladder digital-to-analog converters requiring high accuracy.

An object of the present invention is a highly accurate resistor-ladder circuit with field-effect transistor switching means.

Another object of the invention is a highly accurate resistor-ladder digital-to-analog converter utilizing FET and MOSFET switches.

Still another object of the invention is an accurate resistor-ladder digital-to-analog converter utilizing MOS semiconductor integration techniques.

Yet another object of the invention is an integrated ladder switching circuit.

Features of the invention include the use of field-effect transistor switches of related resistance values in combination with a resistor-ladder network whereby the cumulative resistance produces accurate digital-to-analog signal conversion. The ladder switches are utilized in a dual application whereby leakage currents associated with integrated FET's are offset and thus have negligible effect on converter accuracy. Advantageously, the related resistance values for the FET's are such as to lend themselves to integrated circuit implementation.

These and other objects and features of the invention will be more fully understood from the following detailed description and appended claims when taken with the drawings, in which:

Figure 1:
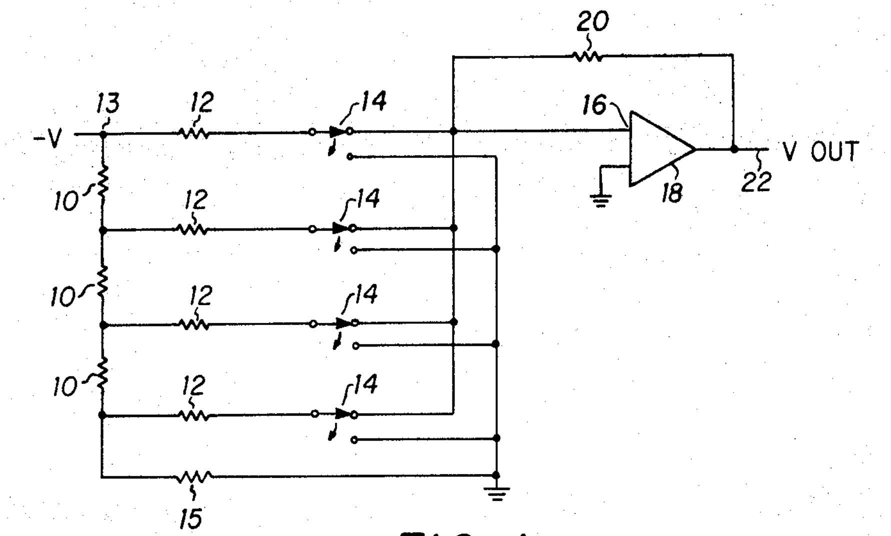
FIG. 1 is a schematic diagram of a conventional resistor-ladder digital-to-analog converter.

Referring now to the drawings, as shown in FIG. 1 and as shown on page 185 of Schmid, supra, a resistor ladder useful in signal conversion comprises a first plurality of serially connected resistors 10 of a first resistance value, R, and a second plurality of resistors 12 of a value twice the first value, or 2R. A reference voltage, −V, is provided at point 13 on the resistor ladder and the resistors 12 cnnect the intermediate points between the serially connected resistors 10 through switches 14 to the input terminal 16 of operational amplifier 18 or circuit ground. Resistor 15 is always connected to ground and provides a current division path for the least significant bit. Resistor 20 is provided in the feedback loop of amplifier 18 and has a resistance value equal to the resistance of each of the first plurality of transistors, R.

By selectively closing the switches 14 in accordance with a digital code with the uppermost switch corresponding to the most significant bit (MSB) and the lowest switch corresponding to the least significant bit (LSB), as labeled, an analog signal is generated at the output 22 of operational amplifier 18.

As above stated, the accuracy of the digital-to-analog converter depends upon the accuracy of the resistor-ladder network. While FET switches have been employed in such a converter, all such known converters heretofore have been limited in accuracy due to the large on-impedance of the MOSFET switches. As described by Schmid, supra, on pages 177–178, in order to obtain an overall conversion accuracy of ±0.05 percent, it is necessary that the errors due to the switches are less than ±0.025 percent. This demands FET on-resistances of less than 15 ohms. While it is not impossible to obtain junction FET or MOSFET switches with on-resistances of 15 ohms or less, they require large geometry switching transistors, which have large feed-through capacitances and high price tags. Thus, attempts to utilize FET switches and accurate resistor-ladder converter by minimizing the resistance of the FET switches, have inherent limitations which makes their use unfeasible. Further, attempts to include the switch resistance in the resistor ladder heretofore required fine trimming of the resistor values which is not feasible due to expense.

In accordance with the present invention, the resistances of the FET switches are utilized in the resistor-ladder network, rather than minimized, all in a manner which lends itself to integrated circuit fabrication techniques and compatibility with standard precision resistors, without the need for resistor trimming.

Figure 2:
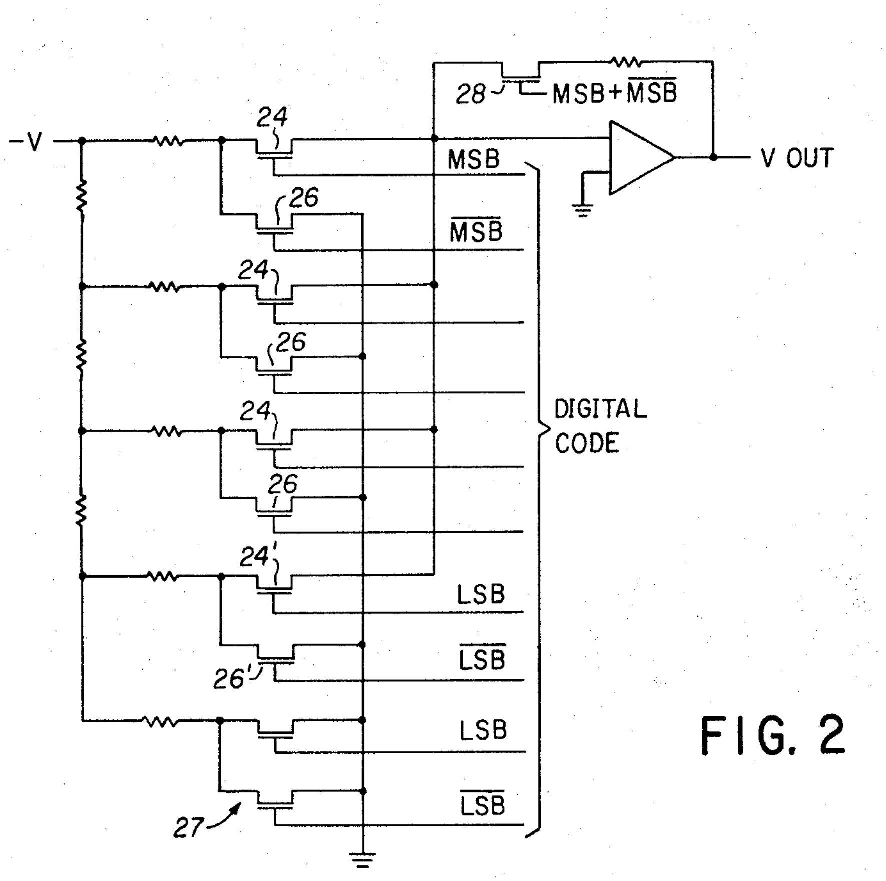
FIG. 2 is a schematic diagram of a resistor-ladder digital-to-analog converter in accordance with the present invention.

Referring to FIG. 2, the converter in accordance with the present invention is similar to the conventional converter illustrated in FIG. 1 with the switches 14 of FIG. 1 being replaced by field-effect transistors shown generally at 24. Again, the most significant bit is controlled by the uppermost transistor switch and the least significant bit is controlled by the lowermost transistor switch of the ladder network, as labeled.

Additionally, a second plurality of field-effect transistor switches shown generally at 26 are connected between the resistor-ladder network and ground. In operation, one transistor 24 and one transistor 26 are paired and operated in toggle fashion whereby one transistor is on and the other transistor is off. For example, considering the least significant bit transistors 24' and 26', when the least significant bit of the digital code is present, transistor 24' is rendered conductive and transistor 26' is nonconductive. Conversely, when the least significant bit of the digital code is not present, transistor 24' is nonconductive and transistor 26' is rendered conductive, thereby applying a ground potential to the resistor-ladder network at the least significant bit and insuring that no current corresponding to the least significant bit is applied to the operational amplifier 18. Transistors shown generally at 27 are connected to ground and provide the current division function for the least significant bit, similar to resistor 15 of FIG. 1.

The circuit of FIG. 2 again uses conventional precision resistors 10 of a standard value, R, and precision resistors 12 of a standard value, 2R, with R equal to 25K ohms for example. However, the resistance values of the field-effect transistor switches are advantageously employed whereby these resistances do not adversely affect the accuracy of the converter. This is accomplished in accordance with the present invention by making the resistance of the field-effect transistor switch for any given bit of the digital code twice the resistance value of the field-effect transistor switch for the next more significant bit. For example, if the resistance of the field-effect transistor switch for the most significant bit is designated $R_S$, the value of the transistor switch for the succeeding bit will be twice $R_S$, or $2R_S$. Similarly, the resistance of the succeeding transistor switch will be twice $2R_S$, or $4R_S$, and so on to assure accurate ladder current division.

It will be noted that a field-effect transistor switch is also provided in the feedback for the operational amplifier 18 and has a resistance value corresponding to the resistance in the most significant bit switch, or $R_S$. This transistor will always be conductive and is included in the feedback path to provide a corresponding total resistance of the feedback path to the total resistance in the most significant bit leg of the resistor-ladder network, thereby providing a unit gain for the most significant bit.

Figure 3:
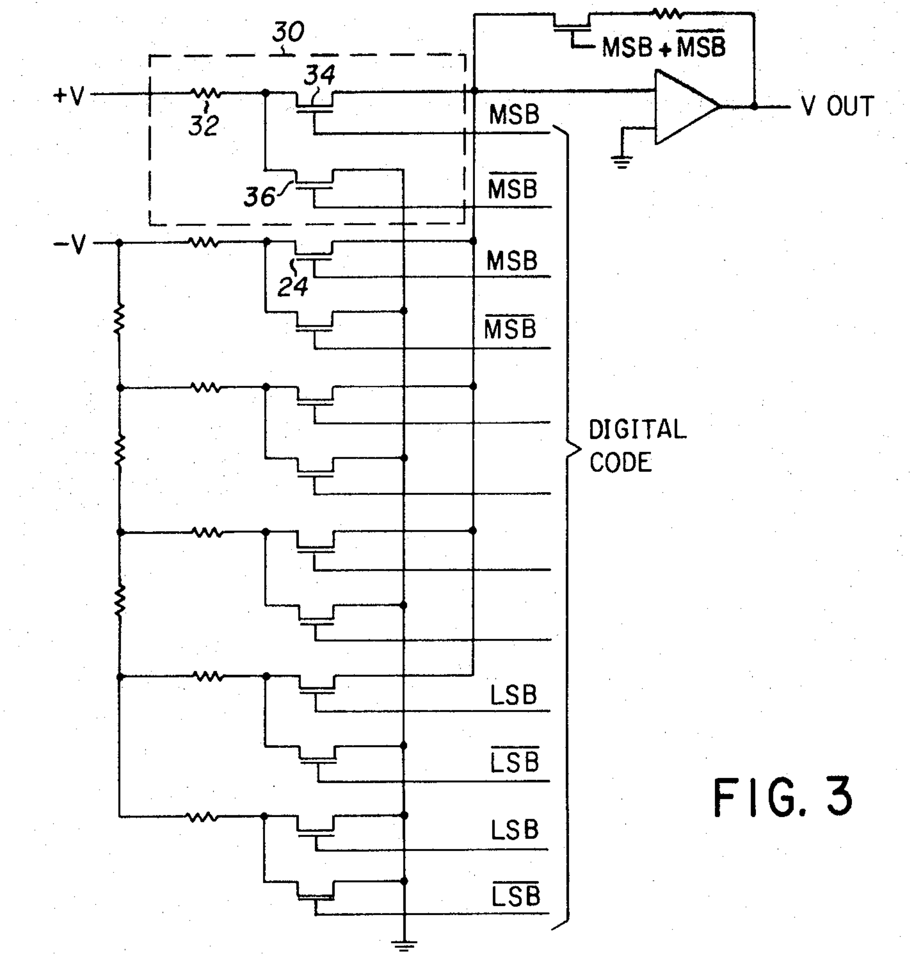
FIG. 3 is a schematic diagram of a resistor-ladder digital-to-analog converter with 2's complement capability in accordance with the present invention.

FIG. 3 is a schematic of another embodiment of a converter in accordance with the present invention similar to the converter of FIG. 2 but including means for processing 2's complement data. In this circuit the additional circuitry designated generally 30 is included to provide the 2's complement capability. Circuitry 30 includes resistor 32 of value R which connects a positive voltage reference, +V, to field-effect transistor switch 34 to the input of operational amplifier 18 and to field-effect transistor switch 36 which is connected to the ground potential. In this embodiment for 2's complement processing, the fixed resistance value of the operational amplifier feedback path is established at the value R so that the total feedback resistance is equal to the total resistance of resistor 30 and switch 34. Also in this embodiment, if the resistance of transistor 34 is designated $R_S$, then the resistance of the transistor 24 corresponding to the most significant bit of the remaining ladder network will be twice this resistance, or $2R_S$. The resistance values for the transistor switches for the succeeding bits of the digital code increase by a power of two, as above described.

As is described further below, the ladder switches for the converter are advantageously constructed in integrated circuit form. An inherent characteristic of MOS integrated circuits, however, is the presence of substrate to source and drain leakage currents, especially at elevated temperatures. This is due to the bias voltage applied to the substrate (e.g. +5V for a N-type substrate and P-type source and drain) to reverse bias the substrate and source-drain junctions, thereby providing electrical isolation between adjacent transistors in the substrate.

Figure 4:
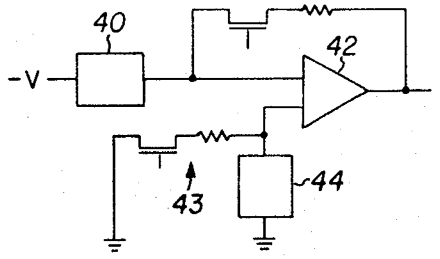
FIG. 4 is a schematic diagram of another embodiment of a converter utilizing ladder switches in a dual application in accordance with the invention.

This leakage current is compensated in accordance with another aspect of the invention by providing identical or "mirror" ladder switches for both input terminals of the operational amplifier as shown in FIG. 4. Block 40 connected to one input of amplifier 42 includes the switching and resistor ladder shown in FIG. 2, supra, and block 44 includes an identical ladder switch array and an equivalent resistor ladder, except high accuracy resistors are not required, connecting the other input terminal to ground. Serially connected transistor and resistor shown generally at 43 are connected in parallel with block 44 to compensate for the feedback path resistance of the operational amplifier. The two ladder switches are operated in unison whereby an equal amount of leakage current flows to each input terminal, thereby canceling the effects of either leakage current on converter accuracy. This is illustrated in the electrical equivalent of the circuit of FIG. 4 illustrated in FIG. 5. The leakage currents are derived from the substrate voltage through the equivalent back-biased variable diodes 45 and 46, of the two ladder switches. The resistor ladder networks are represented by variable resistors 47 and 48 and resistor 43 is the effective feedback path resistance. Since the two ladder switch networks are operated in unison, the variable diodes 45 and 46 are always equal, thus the leakage currents are equal and have canceling and compensating effects on converter accuracy in the common mode rejection of the operational amplifier.

Figure 5:
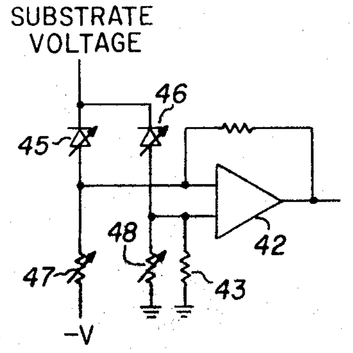
FIG. 5 is an electrical equivalent of the circuit of FIG. 4.
Figure 6:
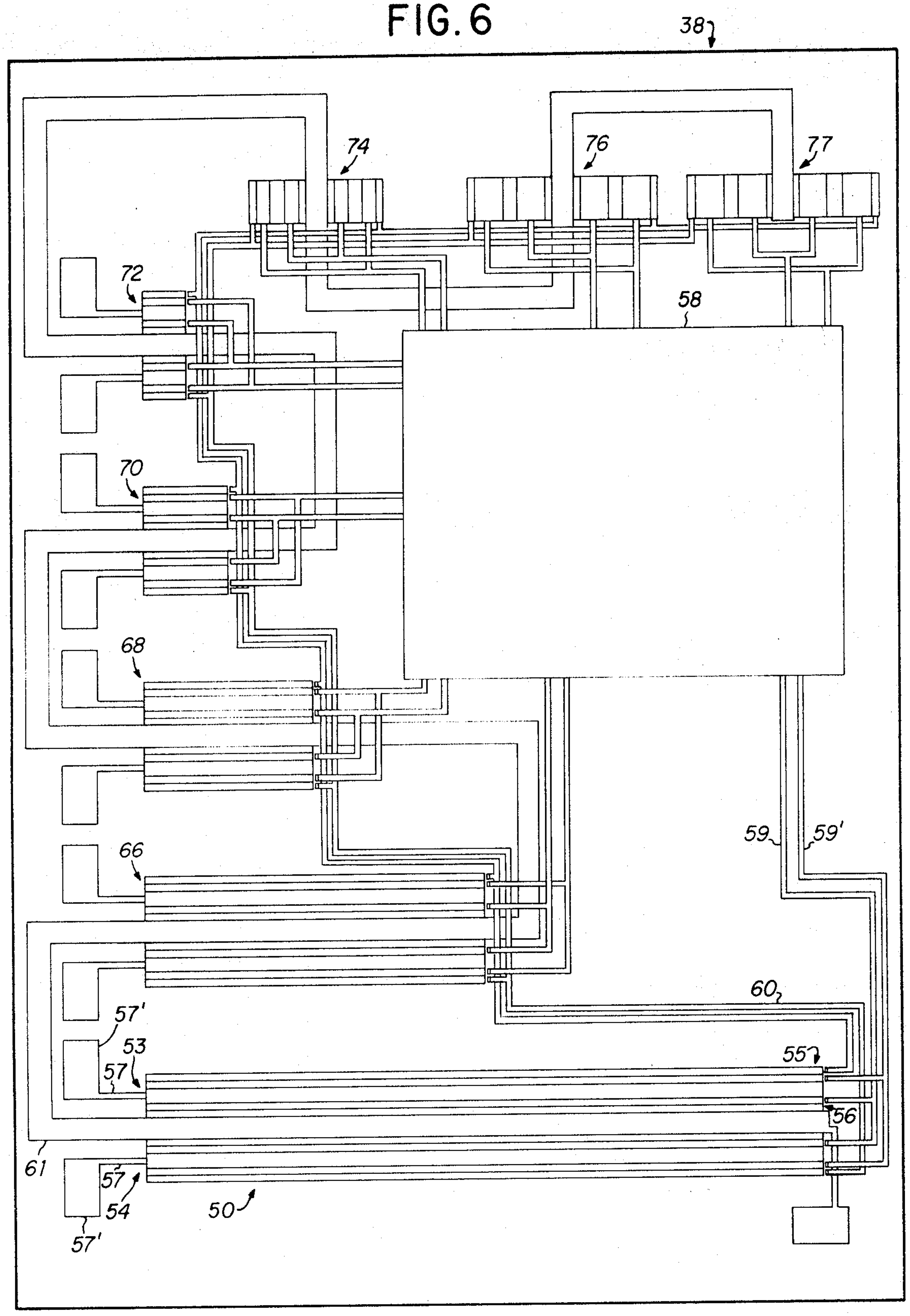
FIG. 6 is a plan view of an integrated circuit layout of the ladder switches useful in the circuit of FIG. 4.

By employing field-effect transistor switches of increasing resistance in the resistor-ladder network, the precise accuracy of the resistor-ladder digital-to-analog converter is maintained. Advantageously, the increasing resistances of the transistor switches as described with reference to FIGS. 4 and 5, are readily accomplished with metal-oxide semiconductor integration techniques as shown in the integrated circuit of FIG. 6. The transistor pairs of each switch network are laid out in semiconductor wafer 38 so that by decreasing the length of the source, gate, and drain and/or increasing the separation between source and drain, resistance values between succeeding pairs of transistors are doubled. For example, the transistor pairs corresponding to the most significant bit shown generally at 50 includes transistor pairs 52 and 54 with transistor pair 52 comprising transistors 55 and 56. This pair of transistors is laid out in conventional manner whereby the source elements of the two transistors are common and are connected to the external resistor ladder through conductive lead 57 and contact 57'. The drive circuitry including storage registers and the like for receiving the externally generated digital code and shown generally at 58, is connected to the transistor gates through conductive leads 59 and 59'. The drain of transistor 55 is connected to the input terminal of the summing amplifier through common buss line 60, and the source of transistor 56 is connected to ground through common buss line 61.

Transistor pair 54 is identical to transistor pair 52, and operates in unison therewith as described with reference to FIGS. 4 and 5. The on-resistance of the transistors is determined by the spacing between source and drain regions and the total length of each transistor. Thus, to double the resistance of the succeeding two transistor pairs corresponding to the next most significant bit, shown generally at 66, the spacing between source and drain is maintained the same but the total length of the transistors is only one-half the length of the transistor pairs 50. Similarly, transistor pairs 68 are one-half the length of transistor pairs 66, and transistor pairs 70 are one-half the length of transistor pairs 68. However, the length of transistor pairs 74 is the same as the length of transistor pairs 72, but the spacing between the source, gate, and drain regions is twice the spacing of the comparable regions of the pairs 72, thereby achieving twice the resistance value as the transistor pairs 72. Similarly, the spacing of the transistor pairs 76 is twice the spacing of transistor pairs 74, thereby providing a resistance for transistor pairs 76 of twice the resistance value of transistor pairs 74. Transistor pair 77 is identical to least significant bit pair 76 and functions the same as transistors 27 of FIG. 2. The feedback transistor and compensating transistor 43 of FIG. 4 are not shown, but these transistors may comprise an additional pair of same configuration as and in juxtaposition with transistor pairs 50.

The digital-to-analog converter and integrated ladder switches utilizing field-effect transistors have proved to be practical and economically feasible as well as maintaining accuracy of the converter. While the invention has been described with reference to specific embodiments, the description is illustrative and is not to be construed as limiting the scope of the invention. Various modifications and changes may occur to those skilled in the art without departing from the spirit and scope of the invention as defined by the appended claims.

I claim:

1. A resistor-ladder circuit as defined by claim 1 and including a second plurality of switch means comprising field-effect transistors, each of said second plurality of field-effect transistors being paired with one of said first plurality of transistors and being connected between the common terminal of the first transistor and the interconnected second plurality resistor and said common terminal, each of said second transistors having the same on-resistance as its paired first transistor.

2. A resistor-ladder circuit as defined by claim 1 wherein said field-effect transistors are MOSFET.

3. The circuit defined by claim 2 and further including an operational amplifier interconnected with said resistor-ladder circuit thereby comprising a digital-to-analog converter with said switch means controlled in accordance with a digital code whereby only one of each paired transistors is on.

4. A resistor-ladder circuit as defined by claim 3 wherein said switch means is part of a semiconductor integrated circuit with the related on-resistances being achieved by varied lengths of the emitter, gate, and source regions and by varied spacing between source and drain regions.

5. The circuit as defined by claim 4 and further including a second resistor-ladder circuit, and wherein semiconductor integrated circuit includes a second plurality of field-effect transistor switch means in pairs corresponding in number and configuration as said first plurality of field-effect transistor switch means, corresponding switch pairs of said first plurality and said second plurality of switch means lying in juxtaposition in said integrated circuit.

6. A resistor-ladder circuit as defined by claim 1 wherein said switch means is part of a semiconductor integrated circuit with the related on-resistances being achieved by varied lengths of the emitter, gate, and source regions and by varied spacing between source and drain regions.

7. The circuit as defined by claim 6 and further including a second resistor-ladder circuit, and wherein semiconductor integrated circuit includes a second plurality of field-effect transistor switch means in pairs corresponding in number and configuration as said first plurality of field-effect transistor switch means, corresponding switch pairs of said first plurality and said second plurality of switch means lying in juxtaposition in said integrated circuit.

* * * * *

UNITED STATES PATENT OFFICE
CERTIFICATE OF CORRECTION

Patent No. 3,755,807 Dated Aug. 28, 1973

Inventor(s) James L. Brown, Marion, Iowa

It is certified that error appears in the above-identified patent and that said Letters Patent are hereby corrected as shown below:

Change Claim 1 to read as follows:

1. A resistor-ladder circuit comprising a voltage source terminal, an output terminal, and a common terminal, a first plurality of resistors serially connected between said voltage source terminal and said common terminal, a second plurality of resistors, a first plurality of switch means, said first plurality of switch means comprising field-effect transistors having different on-resistances which are binarily related to each other, said second plurality of resistors and said first plurality of switch means being interconnected whereby one of said second plurality of resistors and one of said first switch means serially connects a terminal of a resistor of said first plurality to said output terminal, a second plurality of switch means comprising field-effect transistors, each of said second plurality of field-effect transistors being paired with one of said first plurality of transistors and being connected between the common terminal of the first transistor and the interconnected second plurality resistor and said common terminal, each of said second transistors having the same on-resistance as its paired first transistor.

Signed and sealed this 12th day of March 1974.

(SEAL)
Attest:

EDWARD M.FLETCHER,JR.
Attesting Officer

C. MARSHALL DANN
Commissioner of Patents